US007341821B2

(12) United States Patent
Sonokawa

(10) Patent No.: US 7,341,821 B2
(45) Date of Patent: Mar. 11, 2008

(54) METHOD FOR MANUFACTURE OF LITHOGRAPHIC PRINTING PLATE PRECURSOR NO DAMPENING WATER

(75) Inventor: Koji Sonokawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/244,369

(22) Filed: Oct. 6, 2005

(65) Prior Publication Data

US 2006/0078826 A1 Apr. 13, 2006

(30) Foreign Application Priority Data

Oct. 7, 2004 (JP) ......................... P. 2004-295297
Oct. 7, 2004 (JP) ......................... P. 2004-295298

(51) Int. Cl.
*G03F 7/09* (2006.01)
*G03C 1/76* (2006.01)
*G03C 1/775* (2006.01)
*G03C 1/795* (2006.01)

(52) U.S. Cl. ................ 430/302; 430/271.1; 430/272.1; 430/273.1; 430/944

(58) Field of Classification Search ............. 430/271.1, 430/272.1, 302
See application file for complete search history.

(56) References Cited

U.S. PATENT DOCUMENTS 5,888,696 A * 3/1999 Hirano et al. ............ 430/272.1
6,444,393 B2 * 9/2002 Nakamura et al. ....... 430/270.1
6,706,463 B2 * 3/2004 Inno et al. .................. 430/302
6,849,386 B2 * 2/2005 Hirano et al. ............... 430/302

FOREIGN PATENT DOCUMENTS

| | | |
|---|---|---|
| EP | 1 029 666 A1 | 8/2000 |
| EP | 1 112 843 A2 | 7/2001 |
| EP | 1 201 425 A1 | 5/2002 |
| JP | 11-245529 A | 9/1999 |
| JP | 2002-240452 | 8/2002 |
| JP | 2002-240452 A | 8/2002 |
| WO | WO-90/02045 | 3/1990 |

* cited by examiner

*Primary Examiner*—Sin Lee
(74) *Attorney, Agent, or Firm*—Birch, Stewart, Kolasch & Birch, LLP

(57) ABSTRACT

A method for manufacturing a lithographic printing plate precursor requiring no dampening water including: a support, a light-to heat conversion layer; and a silicone rubber layer in this order. The method includes: subjecting a surface of the support to a corona discharge treatment in a discharge amount of 0.01 to 0.12 $kW/m^2$/minute; or subjecting a surface of the support to a corona discharge treatment so that the surface has an element ratio of oxygen to carbon of 0.41 or more, which is measured by an X-ray photoelectron spectroscopic; and providing the light-to-heat conversion layer directly on the surface of the support.

5 Claims, No Drawings

METHOD FOR MANUFACTURE OF LITHOGRAPHIC PRINTING PLATE PRECURSOR NO DAMPENING WATER

FIELD OF THE INVENTION

The present invention relates to a method for manufacturing a highly-sensitive lithographic printing plate precursor being able to print without dampening water (hereinafter, referred to as "waterless lithographic printing plate precursor") which is able to form image by a heat mode recording by laser beam and, more particularly, it relates to a method for manufacturing a waterless lithographic printing plate precursor having excellent resistance to scratch.

BACKGROUND OF THE INVENTION

In one type of printing method where dampening water is necessary, control of a delicate balance between dampening water and ink is difficult and there are big problems that ink is emulsified or ink is mixed with the dampening water whereby unfavorable concentration of the ink or stain of the ground are generated resulting in loss of paper. On the contrary, a waterless lithographic printing plate precursor does not require dampening water and, therefore, it has many advantages.

On the other hand, as a result of quick progress in an output system in recent years such as prepress system, image setter and laser printer, there have been proposals for the manufacture of printing plate by a new plate-making method such as computer-to-plate and computer-to-cylinder and there has been a demand for printing materials of a new type for such printing systems and development has been carried out.

An example of waterless lithographic printing plate precursors on which writing by laser is possible is a lithographic printing precursor where an ink-repulsive silicone rubber layer is provided on a layer for converting light to heat (hereinafter, referred to as a light-to-heat conversion layer) comprising a layer containing a laser beam-absorber such as carbon black and a binder or a thin metal membrane layer. When laser is irradiated on this lithographic printing plate precursor, a silicone rubber layer which is the irradiated part is removed to give an ink-attached region (image area) while non-irradiated part which is a region where silicone rubber layer remains becomes an ink-repulsive region (non-image area) whereupon a printing without water is now possible.

In such a waterless lithographic printing plate precursor, cost of the manufacture is low and, in addition, image is formed by utilizing the abrasion of light-to-heat conversion layer of the laser-irradiated part and, therefore, there is an advantage that generated gas pushes up the silicone rubber layer of the laser irradiated part and removal of the silicone rubber layer of the laser irradiated part thereafter (hereinafter, referred to as development) is able to be carried out efficiently.

There is also a disclosure for an embodiment that such a waterless lithographic printing plate precursor is made into a roll shape and attached in the plate drum of a printer, supplied on the plate drum so as to make the printing surface of the waterless lithographic printing plate precursor front and spooled so as to position the new side of the waterless lithographic printing plate precursor to a printing region of a plate drum, laser is scanned in a image-forming manner on the aforementioned plate drum and printing is conducted after the silicone rubber layer of the laser irradiated part is removed (for example, refer to WO 90/02045).

However, in such a waterless lithographic printing plate precursor, troubles of scratching of non-image area during a developing treatment step after writing and recording by laser and a printing step are apt to happen. For example, when the developing treatment step is in such a system that a plate surface is scrubbed by a brush or a pad for development impregnated with a developing treatment solution whereby the silicone rubber layer at the laser irradiated area is removed, fine cracks and exfoliations are generated on the non-image area by dust attached to the pad or the like for development resulting in a ink stain of the print.

As a means for improving the aforementioned scratching of silicone rubber layer, application of corona discharge treatment to a support has been proposed and there is a description that the condition for the corona discharge treatment (treating amount) of 1 $W/m^2$/minute to 200 $W/m^2$/minute is effective (refer to JP 11/245,529 A). It has been also known that, in an lithographic printing plate precursor having a heat sensitive layer containing carbon black and polymer binder on a support and having a hydrophilic layer or a lipophobic layer on the heat sensitive layer, resistance to scratch, resistance to printing and image reproduction property are good when a substance where carbon black is oxidized is used (refer to JP 2002/240,452 A).

However, in the aforementioned corona discharge, useless damage and residue are resulted on the surface of the support so that close adhesion of the support to the light-to-heat conversion layer is deteriorated whereby there are some cases where non-image area is scratched and staining with printing ink is generated. In addition, improvement in resistance to scratch by carbon black which is subjected to an oxidizing treatment gives still insufficient effect.

SUMMARY OF THE INVENTION

An object of an illustrative, non-limiting embodiment of the present invention is to solve the aforementioned problem in the waterless lithographic printing plate precursor where image formation is conducted utilizing the aforementioned abrasion, to suppress the scratching of the non-image area in the steps of developing treatment, printing, etc. and to provide a method for the manufacture of waterless lithographic printing plate precursor where the problem of stain by printing ink is suppressed.

As a result of intensive investigations, the present inventors have found that amount of the corona discharge treatment for the support and time from the corona discharge treatment to installment of a light-to-heat conversion layer are stipulated and that element composition of the support surface produced by the corona discharge treatment is important for the resistance to scratching whereupon the present invention has been achieved.

Thus, the present invention is as follows.

(1) A method for manufacturing a lithographic printing plate precursor requiring no dampening water, the lithographic printing plate precursor comprising: a support, a light-to heat conversion layer; and a silicone rubber layer in this order, the method comprising; subjecting a surface of the support to a corona discharge treatment in a discharge amount of 0.01 to 0.12 $kW/m^2$/minute; and providing the light-to-heat conversion layer directly on the surface of the support after 10 minutes to one month from the corona discharge treatment.

(2) The method for manufacturing a lithographic printing plate precursor requiring no dampening water according to the aforementioned (1), wherein the support comprises a biaxially-stretched polyethylene terephthalate.

(3) The method for manufacturing a lithographic printing plate precursor requiring no dampening water according to the aforementioned (1) or (2), wherein the discharge amount is 0.06 to 0.09 kW/$m^2$/minute.

(4) A method for manufacturing a lithographic printing plate precursor requiring no dampening water, the lithographic printing plate precursor comprising: a support, a light-to heat conversion layer; and a silicone rubber layer in this order, the method comprising: subjecting a surface of the support to a corona discharge treatment so that the surface has an element ratio of oxygen to carbon of 0.41 or more, which is measured by an X-ray photoelectron spectroscopic; and providing the light-to-heat conversion layer directly on the surface of the support.

(5) The method for manufacturing a lithographic printing plate precursor requiring no dampening water according to any of the aforementioned (1) to (4), wherein the light-to-heat conversion layer comprises carbon black that is subjected to an oxidizing treatment.

(6) The method for manufacturing a lithographic printing plate precursor requiring no dampening water according to the aforementioned (5), wherein the light-to-heat conversion layer has a carbon black content of 35% by weight or more based on a total solid content of the light-to-heat conversion layer.

(7) A lithographic printing plate precursor requiring no dampening water, comprising: a support having a surface that is subjected to a corona discharge treatment so that the surface has an element ratio of oxygen to carbon of 0.41 or more, which is measured by an X-ray photoelectron spectroscopic; a light-to-heat conversion layer provided directly on the surface of the support; and a silicone rubber layer in this order.

(8) The lithographic printing plate precursor requiring no dampening water according to the aforementioned (7), wherein the light-to-heat conversion layer comprises carbon black that is subjected to an oxidizing treatment.

(9) The lithographic printing plate precursor requiring no dampening water according to the aforementioned (8), wherein the light-to-heat conversion layer has a carbon black content of 35% by weight or more based on a total solid content of the light-to-heat conversion layer.

It has been well known that surface energy generally lowers after a corona discharge treatment when hydrophobic substances gradually adhere to a high-energy surface containing hydroxyl group, carboxylic acid group, etc. produced on the surface of the support as a result of corona discharge. Incidentally, the present inventors have found that the corona discharge treatment more effectively acts and resistance to scratching is better in the lithographic printing plate precursor provided with a light-to-heat conversion layer after 10 minutes from the corona discharge on the support than the case of immediately after the corona discharge treatment thereon. Although the reason therefor has not been clarified yet, it is presumed that, immediately after the corona discharge treatment, active species having very highly reactivity exist on the surface of the support and, when a light-to-heat conversion layer is provided in that state, some substances such as a binder in the light-to-heat conversion layer reacts with the active species so that a part of them may be decomposed and that acts on the resistance to scratching in an disadvantageous manner. The present inventors have also found that the composition of elements on the surface of the support produced by the corona discharge treatment is important for the resistance to scratching.

When a light-to-heat conversion layer is provided within the aforementioned elapsed period according to the present invention after the corona discharge treatment onto the support or, when composition of elements formed on the surface of the support by the corona discharge is specified, it is now possible to efficiently improve the close adhesion of the support to the light-to-heat conversion layer whereby it has now been able to be achieved to make the resistance to scratching good which is an object of the present invention.

According to the present invention, in an embodiment where image pattern formation is conducted by laser beam irradiation and removal of silicone rubber layer of an exposed part and printing is done, a method for the manufacture of waterless lithographic printing plate precursor where printing without stain by ink due to scratch of non-image area is possible is able to be provided.

In the waterless lithographic printing plate precursor according to the present invention, it is also possible to print where stain by ink caused by scratch of non-image area during a development treating step and a printing step is suppressed even in an embodiment where the plate is provided in a plate drum of a printer and supplied on a plate drum so as to make the image forming surface front, formation of image pattern and makeup of orthographic printing plate are conducted by scanning exposure of image by infrared laser beam based on a digital signal on the printer and printing is conducted in the same printer using said printing plate.

DETAILED DESCRIPTION OF THE INVENTION

Hereinafter, an exemplary embodiment of the method for manufacturing a waterless lithographic printing plate precursor according to the present invention will be illustrated in detail.

In a waterless lithographic printing plate precursor according to the present invention, at least a light-to-heat conversion layer and a silicone rubber layer are successively layered on a support. Here, the expression of "successively layered" means that those layers are layered in the above-mentioned order and, although the presence of other layers such as overcoat layer and intermediate layer is not denied, the light-to-heat conversion layer is placed directly on a support. It is also possible that a back layer is provided on a support at a side which is opposite to the side where the light-to-heat conversion layer and silicone rubber layer are provided.

Firstly, a support and a corona discharge treatment thereto which are characteristic features of the present invention will be illustrated.

(Support)

A support used for the waterless lithographic printing plate precursor according to the present invention has flexibility to such an extent that it is able to be set to common printers and also is durable to the load applied upon printing. Therefore, as representative supports, it is possible to use plastic film such as polyester (e.g., polyethylene terephthalate and polyethylene-2,6-naphthalate), polyethylene, polypropylene, polystyrene, poly(vinyl chloride), poly(vinylidene chloride), poly(vinyl alcohol), fluorine resin, polycarbonate, polyacetate, plyamide and polyimide and a product where the above is compounded with paper, metal or alloy (such as a coated paper where polyethylene sandwiches the upper and lower sides of paper and a product where polyethylene terephthalate is layered on aluminum) although they are non-limitative. The plastic film may be any of non-stretched one, uniaxially stretched one and biaxially-stretched one. Preferably, it is polyethylene terephthalate film and, more preferably, it is a biaxially-stretched polyethylene terephthalate film. With regard to the polyethylene terephtbalate film, that which contains hollows as mentioned in JP 09/314,794 A may be used.

In the present invention, it is essential that a corona discharge treatment is applied to the surface of the support to which light-to-heat conversion layer and silicone rubber layer are layered. Treating amount of the corona discharge treatment is usually expressed by a discharged amount per unit area and unit time. Its practical range in the present invention is 0.01 to 0.12 kW/$m^2$/minute and, preferably, 0.06 to 0.09 kW/$m^2$/minute. When it is less than 0.01 kW/$m^2$/minute, no effective result is achieved for resistance to scratch while, when it is more than 0.12 kW/$m^2$/minute, it is apt to cause unnecessary damage to a support.

However, even in a support which is treated with the same corona discharge treatment amount, the effect by the corona discharge treatment changes as a result of lapse of time after the corona discharge treatment. In an embodiment of the present invention, a light-to-heat conversion layer is provided within 10 minutes to one month after the corona discharge treatment to the support. Preferred range for the elapsed time from the corona discharge treatment to the support until the installment of a light-to-heat conversion layer is 30 minutes to one week and, more preferably, 1 hour to 3 days. When the elapsed time is shorter than 10 minutes or longer than one month, no effective result for resistance to scratch is achieved.

As a result of the above, it is now possible to efficiently improve the close adhesion of the support to the light-to-heat conversion layer whereby it is now achieved to make the resistance to scratch of the non-image area good which is an object of the present invention.

When a support after the corona discharge treatment is made to elapse for the aforementioned time, a support in a coil shape is subjected to a corona discharge treatment by handling in a web-like manner and it is made to elapse in a wound-up state. That is preferred in view of productivity and prevention of adhesion of contaminants. With regard to the environment for temperature and humidity at that time, they are preferred to be 5 to 45° C. and 25 to 75% RH, respectively.

In another embodiment of the present invention, an object of the present invention is able to be achieved when a corona discharge treatment is carried out in such a manner that ratio of elements of oxygen to carbon (hereinafter, it will be abbreviated as O/C element ratio) measured by an X-ray photoelectron spectroscopic assay (ESCA) for the surface of polyethylene terephthalate is made 0.41 or more. More preferably, the O/C element ratio is 0.45 or more. The ESCA used here may also be called XPS and is an analytical means where kinetic energy of photoelectron emitted from the surface by a photoelectric effect is measured and, since escape depth of photoelectron is a few centimeters, information concerning atoms and molecules constituting the layers near the outermost surface of solid is able to be obtained by that. Thus, it is possible to obtain the information for element composition for the outermost layer of a support which has a very big influence on close adhesion to a layer provided on the support.

In order to make the element composition of the surface of the support by means of a corona discharge treatment within the aforementioned range, resistance of the non-image area to scratching is enhanced. That is presumably because hydroxyl group and carboxylic acid group are produced on the surface of the support such as polyethylene terephthalate as a result of the corona discharge treatment whereby polarity becomes high and interaction with a light-to-heat conversion layer becomes strong and, as a result, closely adhering property is improved. The effect as such is further improved by means of a combination with a light-to-heat conversion layer containing carbon black being subjected to an oxidizing treatment which will be mentioned later.

It is appropriate that thickness of the support used in the present invention is 25 μm to 3 mm and, preferably, 75 μm to 50 μm but, depending upon the printing condition, the optimum thickness varies. Usually, it is most preferred to be 100 μm to 300 μm.

(Light-to-Heat Conversion Layer)

With regard to the light-to-heat conversion layer which is used in the present invention, it is possible to use known substances having a function of converting laser beam used for writing to heat (light-to-heat conversion) and, when laser beam source is infrared laser, it has been already known that various kinds of organic and inorganic materials which are able to absorb the light of wavelength used for writing laser such as infrared absorptive pigment, infrared absorptive dye, infrared absorptive metal and infrared absorptive metal oxide are able to be used. It is also possible that such a light-to-heat conversion agent is used in a form of a mixed membrane with other components such as a binder and an additive.

Examples of such a light-to-heat conversion agent are various kinds of carbon blacks such as acidic carbon black, basic carbon black and neutral carbon black; various kinds of carbon black which was subjected to surface modification or surface coating for improvement in dispersing property etc.; black pigment such as Nigrosine, Aniline Black and Cyanine Black; green pigment such as phthalocyanine and naphthalocyanine; carbon graphite; aluminum; iron powder; diamine-type metal complex; dithiol-type metal complex; phenol-thiol-type metal complex; mercaptophenol-type metal complex; arylaluminum-type metal complex; inorganic compound containing water of crystallization; copper sulfate; chromium sulfide; silicic acid compound; metal oxide such as titanium oxide, vanadium oxide, manganese oxide, iron oxide, cobalt oxide, tungsten oxide and indium tin oxide; hydroxide and sulfate of such a metal; powder of metal such as bismuth, tin, tellurium, iron and aluminum; etc. and it is preferred to add the additive as such.

Besides the above, with regard to organic dyes, various compounds mentioned in "Infrared Sensitizing Dyes" (by Matsuoka; Plenum Press, New York, N.Y. (1990)) and U.S. Pat. No. 4,833,124, European Patent No. 321,923, U.S. Pat. Nos. 4,772,583, 4,942,141, 4,948,776, 4,948,777, 4,948,778, 4,950,636, 4,912,083, 4,952,552, 5,023,229, etc. may be exemplified although they are non-limitative.

Among them, carbon black is particularly preferred in view of light-to-heat conversion rate, economy and actual handling. Depending upon its production process, carbon black is classified into furnace black, lamp black, channel black, roll black, disk black, thermal black acetylene black, etc. and furnace black is preferably used because it is available in the market in various types thereof in terms of particle size, etc. and is also commercially at low cost. In carbon black, degree of aggregation of its primary particles affects on the sensitivity of a plate material. When the degree of aggregation of primary particles of carbon black is high (having a high-structured structure), degree of blackness of the plate material does not increase when comparison is made in the same adding amount whereby index of absorption of laser beam lowers and, as a result, sensitivity lowers. Moreover, due to the particle aggregation, viscosity of the light-to-heat conversion layer applying solution becomes high and thixotropic property is generated whereby handling of the application solution becomes difficult and the applied coat does not become uniform. On the other hand, when degree of aggregation is low, dispersing property of carbon black lowers and sensitivity of the plate is also apt to become low. Degree of aggregation of primary particles of carbon black as such is able to be compared by means of a value which is called an oil-absorbing amount and, when the oil-absorbing amount is high, degree of aggregation becomes high while, when it is low, degree of aggregation becomes low. Thus, it is preferred to use carbon black where an oil-absorbing amount is within a range of 20 to 300 ml/100 g and, more preferably, 50 to 200 ml/100 g.

With regard to carbon black, that of various particle sizes has been put into the market and the particle size of the primary particles thereof also affects the sensitivity of the plate material. When an average particle size of the primary particles is too small, the light-to-heat conversion layer itself becomes transparent and is unable to efficiently absorb the laser beam whereupon sensitivity of the plate material lowers. When it is too large, particles are not dispersed in high density, degree of blackness of the light-to-heat conversion layer is not enhanced and laser beam is unable to be efficiently absorbed whereby sensitivity of the plate material also lowers. Thus, it is preferred to use carbon black where an average particle size of the primary particles is within a range of 10 to 50 nm and, more preferably, 15 to 45 nm.

It is also possible to increase the sensitivity of the plate material when a conductive carbon black is used. In that case, it is preferred that conductivity is within a range of 0.01 to 100 $\Omega^{-1}cm^{-1}$ and, more preferably, 0.1 to 10 $\Omega^{-1}cm^{-1}$. To be more specific, "Conductex" 40-220, "Conductex" 975 Beads, "Conductex" 900 Beads, "Conductex" SC, "Battery Black" (manufactured by Columbian Carbon Japan), #3000 (manufactured by Mitsubishi Chemical), "Denka Black" (manufactured by Denki Kagaku Kogyo), etc are used more preferably.

Among the carbon blacks as such, the carbon black which is subjected to an oxidizing treatment is particularly effective in the present invention. With regard to the carbon black which is subjected to an oxidizing treatment, known ones may be used. They are carbon blacks which are subjected to an oxidizing treatment mentioned, for example, in JP 48/18,186 A, JP 52/2874 B, JP 57/15,856 A, JP 46/28,368 B, JP 52/13,807 B, JP 52/13,808 B, JP 03/124,773 A, JP 08/3,498 A, JP 07/258,578 A, JP 20/195,331 A, JP 20/212,425 A, JP 10/212,426 A, JP 10/237,349 A, JP 10/330,643 A, JP 11/166,131 A, JP 2000/7,937 A, JP 2000/7,938 A, JP 05/171,056 A, JP 08/199,068 A, JP 09/304,760 A and JP 09/194,775 A.

The oxidized carbon black is produced by subjecting the aforementioned various kinds of carbon blacks to an oxidizing treatment. Examples of a method for conducting an oxidizing treatment are a method for oxidizing with air where it is contacted to and made to react with air under a high-temperature atmosphere, a gas-phase oxidizing method (including a treatment with plasma) where it is made to react with nitrogen oxide, ozone, sulfur oxide or fluorine gas and a liquid-phase oxidizing method using nitric acid, potassium permanganate, chlorous acid, sodium hypochlorite, aqueous solution of bromine, aqueous solution of ozone, hydrogen peroxide, etc. and each of them may be conducted solely or two or more thereof may be used jointly whereupon an oxidizing treatment is achieved. As a result of subjecting to the aforementioned oxidizing treatment, oxygen functional group such as carbonyl group, carboxyl group and hydroxyl group existing on the surface of the carbon black used as a material increases.

In the degree of oxidizing treatment as such, pH of carbon black and value of volatile substances are indexes therefor and, in the case of the carbon black subjected to an oxidizing treatment according to the present invention, pH is preferably 6.5 or lower and, more preferably, 2 to 4 while volatile substances are preferably 1% by mass (by weight) or more and, more preferably, 1.5 to 15% by mass. Here, pH is able to be determined by measuring a mixed liquid of carbon black with distilled water using a glass electrode meter. Value of volatile substances is determined by expressing the reduction in the mass upon heating of carbon black at 950° C. for 7 minutes in terms of percentage. The carbon black which is oxidized as such may be used either solely or two or more thereof may be used jointly. The effect in the present invention is particularly effective in a region where amount of oxidized carbon black in the light-to-heat conversion layer is abundant.

With regard to the oxidized carbon black used in the present invention, it is also possible to use a commercially available product.

To be more specific, the following products may be exemplified. They are:

Carbon Black #50, #2700B, #2650, #2450B, #2400B, #2350, #1000, #970, #3030B, #3230B, MA-11, MA-220, MA-230, MA-77, MA-7, MA-8, MA-100R, MA-200RB and MA-14 manufactured by Mitsubishi Chemical;

Monarch 1300, Mongul L, Regal 400R and Vulcan XC-72R manufactured by Cabot; and

Color Black FW200, Color Black FW2, Color Black FW1, Color Black FW18, Color Black S170, Color Black S160, Special Black 550, Special Black 350, Special Black 250, Special Black 100, Printex 150T, Printex U, Printex V, Printex 140U and Printex 140V manufactured by Degussa.

Adding amount of the light-heat converting agent used in the present invention to the total solid mass of the light-to-heat conversion layer (i.e., light-heat converting agent content based on the total solid content in the light-to-heat conversion layer) is 10 to 70% by mass, preferably 20 to 60% by mass and, more preferably, 35% by mass to 50% by mass. Within such a range, membrane strength of the light-to-heat conversion layer does not lower and close adhesion to the adjacent layer does not lower as well whereby a good sensitivity is achieved.

When the light-to-heat conversion layer is a single membrane, it is possible that a membrane containing at least one member of metal (such as aluminum, titanium, tellurium, chromium, tin, indium, bismuth, zinc and lead), alloy thereof, metal oxide, metal carbide, metal nitride, metal borate, metal fluoride and organic dye is formed on a support by a vapor deposition method or by a sputtering method.

When the light-to-heat conversion layer is a mixed membrane, it is able to be formed by a method where a light-to-heat conversion agent is dissolved or dispersed in a binder and applied together with other components. With regard to the aforementioned binder, a known binder which is able to dissolve or disperse a light-to-heat conversion agent is used and its examples are cellulose and derivative thereof such as nitrocellulose and ethylcellulose; homopolymer and copolymer of acrylate; homopolymer and copolymer of methacrylate such as poly(methyl methacrylate) and poly(butyl methacrylate); an acrylate-methacrylate copolymer; homopolymer and copolymer of styrene monomer such as polystyrene and α-methylstyrene; various kinds of synthetic rubbers such as polyisoprene and styrene-butadiene copolymer; homopolymer of vinyl ester such as poly(vinyl acetate); copolymer containing vinyl ester such as a vinyl acetate-vinyl chloride copolymer; various kinds of condensed polymer such as polyurea, polyurethane, polyester and polycarbonate; and a binder used for the so-called "chemical amplification system" such as those mentioned in *J. Imaging Sci*., pages 59-64, 30(2), (1986) (Frechet, et al.), "Polymers in Electronics (Symposium Series, P11, 242, T. Davidson, Ed., ACS, Washington, D.C. (1984) (Ito, Willson)) and *Microelectronic Engineerings*, pages 3-10, 13 (1991) (E. Reichmanis, L. F. Thompson)".

Among them, in view of close adhesion to a silicone rubber layer which will be mentioned later, polyurethane resin is preferred. Polyurethane resin which is used for a light-to-heat conversion layer is able to be produced by a polymerization addition reaction of a diisocyanate compound with a diol compound. Examples of the diisocyanate compound are an aromatic diisocyanate compound such as 2,4-tolylene diisocyanate, 2,4-tolylene diisocyanate dimer, 2,6-tolylene diisocyanate, p-xylylene diisocyanate, m-xylylene diisocyanate, 4,4'-diphenylmethane diisocyanate, 4,4'-(2,2-diphenylpropane) diisocyanate, 1,5-naphthylene diisocyanate and 3,3'-dimethylbiphenyl 4,4'-diisocyanate; an aliphatic diisocyanate compound such as hexamethylene diisocyanate, trimethylhexamethylene diisocyanate, lysine diisocyanate and dimeric acid diisocyanate; an alicyclic diisocyanate compound such as isophorone diisocyanate, 4,4'-methylenebis(cyclohexyl isocyanate), methylcyclohedxane 2,4(or 1,6)-diisocyanate and 1,3-(isocyanate methyl)-cyclohexane; and a diisocyanate compound which is a reaction product of diol with diisocyanate such as an adduct of 1 mol of 3-butylene glycol to 2 mol of tolylene diisocyanate.

Examples of the diol compound are ethylene glycol, diethylene glycol, triethylene glycol, tetraethylene glycol, polyethylene glycol, propylene glycol, 1,2-dipropylene glycol, 1,2-tripropylene glycol, 1,2-tetrapropylene glycol, 1,3-dipropylene glycol, polypropylene glycol, 1,3-butylene glycol, 1,3-dibutylene glycol, neopentyl glycol, 1,6-hexanediol, 2-butene-1,4-diol, 2,2,4-trimethyl-1,3-pentanediol, 1,4-bis-β-hydroxyethoxycyclohexane, cyclohexane dimethanol, tricyclodecan dimethanol, bisphenol A, hydrogenated bisphenol A, hydrogenated bisphenol F, bisphenol S, hydroquinone dihydroxyethyl ether, p-xylylene glycol, dihydroxyethylsulfone, 2,2'-dimethylolpropanoic acid, bis(2-hydroxyethyl)-2, 4-tolylene carbamate, 2,4-tolylenebis(2-hydroxyethylcarbamide), bis(2-hydroxyethyl)-m-xylylene dicarbamate and bis (2-hydroxyethyl) isophthalate, Polyether produced by a condensation reaction of those diol compounds and polyester diol produced by a condensation reaction of a dicarboxylic acid such as adipic acid or terephthalic acid with the above diol compound may be also listed. It is also possible for such a polyurethane resin to use a chain ligating agent such as a diamine compound, a hydrazine or a hydrazine compound upon its synthesis.

Polyurethane disclosed in JP 2001/188,339 A and JP 2002/144,749 A is able to be used particularly preferably in view of sensitivity and stability upon storage of sensitive materials.

With regard to the adding amount of the aforementioned binder used for the light-to-heat conversion layer of the present invention, it is preferably 10 to 95% by mass or, more preferably, 40 to 80% by mass to the total solid of the light-heat converting agent.

When a light-to-heat conversion layer is produced as a mixed membrane, it is possible to add various kinds of additives to the light-to-heat conversion layer depending upon various objects such as for improving the mechanical strength of the light-to-heat conversion layer, for improving the sensitivity of laser record, for improving the dispersing property of a light-to-heat conversion agent in the light-to-heat conversion layer and for improving the close adhesion to the layer adjacent to the light-to-heat conversion layer.

For example, in order to improve the mechanical strength of a light-to-heat conversion layer, various kinds of cross-linking agents which harden the light-to-heat conversion layer may be added. Examples of the cross-linking agent is a combination of a polyfunctional isocyanate compound or a polyfunctional epoxy compound with a hydroxy-containing compound, a carboxylic acid compound, a thiol-type compound, an amine-type compound, a urea-type compound, etc. although they are non-limitative. Adding amount of the cross-linking agent used in the present invention to the total light-to-heat conversion layer composition is 1 to 50% by mass and, preferably, 2 to 20% by mass. When the adding amount is made 1% by mass or more, an effect by cross-linking is achieved and, when it is made 50% by mass or less, the membrane strength of the light-to-heat conversion layer does not become too strong, a shock absorbing effect when pressure from outside is applied to the silicone rubber layer does not disappear and resistance to scratch does not lower.

It is also possible to add a known compound which generates gas by decomposition upon heating for improving the sensitivity of the laser recording. In that case, sensitivity of laser recording is able to be improved by a quick expansion of volume of the light-to-heat conversion layer and, as to the examples of the additive, dinitropentamethylenetetramine, N,N'-dimethyl-N,N'-dinitrosoterephthalamide, p-toluenesulfonyl hydrazide, 4,4-oxybis(benzenesulfonylhydrazide) and diamidobenzene may be used. In order to improve the sensitivity of laser recording, it is possible to use a known compound which is an acid generator by heating which produces an acidic compound upon decomposition by heating such as various kinds of iodonium salt, sulfonium salt, phosphonium tosylate, oxime sulfonate, dicarbodiimide sulfonate and triazine as an additive. When they are used together with a binder of a chemical amplification type, decomposing temperature of a binder of a chemical amplification type which is a constituting substance for the light-to-heat conversion layer is able to be greatly lowered and, as a result, it is now possible to improve the sensitivity of laser recording. When pigment such as carbon black is used for a light-to-heat conversion agent, various kinds of pigment dispersing agents are able to be used as additives only for improvement of dispersion of pigment.

Adding amount of the pigment dispersing agent used in the present invention to the light-heat converting agent is 1 to 70% by mass and, preferably, 5 to 50% by mass. When the adding amount is 1% by mass or more, an effect of improving the dispersing of the pigment is available and sensitivity of the plate material does not lower while, when it is 70% by mass or lower, close adhesion to the adjacent layer does not lower. In order to improve the close adhesion to the adjacent layer, it is possible to add a known improving agent for close adhesion such as a silane coupling agent and a titanate coupling agent and a binder having a good close adhesion to the adjacent layer such as resin of a vinyl-containing acrylate type, resin of a hydroxyl-containing acrylate type, resin of an acrylamide type, ethylene-vinyl acetate copolymer, vinyl chloride-vinyl acetate copolymer, cellulose derivative and gelatin. Adding amount of the aforementioned improving agent for close adhesion and improving binder for close adhesion to the total light-to-heat conversion layer composition is 5 to 70% by mass and, preferably, 10 to 50% by mass. When the adding amount is 5% by mass or more, there is an effect of improving the close adhesion to the adjacent layer and, when it is 70% by mass or less, sensitivity of the plate material does not lower.

In order to improving the applicability, it is possible to use a surfactant such as surfactant of a fluorine type or surfactant of a nonionic type as an additive. Adding amount of the surfactant used in the present invention to the total light-to-heat conversion layer composition is 0.01 to 10% by mass and, preferably, 0.05 to 1% by mass. When the adding amount is 0.01% by mass or more, formation of a light-to-heat conversion layer having good applicability and being uniform becomes easy and, when it is 10% by mass or less, close adhesion to the adjacent layer does not lower. Besides the above, various kinds of additives may be used upon necessity.

Applying amount (coating amount) of the solution for formation of a light-to-heat conversion layer used in the present invention is usually 0.05 to 10 g/m$^2$ or, preferably, 0.1 to 5 g/m$^2$. The light-to-heat conversion layer used in the present invention is able to be formed by application of applying solution for formation of light-to-heat conversion layer on a support using a commonly well-known method such as a dip coating method, an air knife coating method, a curtain coating method, a wire bar coating method, a gravure coating method and an extrusion coating method followed by drying.

(Silicone Rubber Layer)

The ink-repulsive silicone rubber layer used in the present invention is formed by means of reaction and formation of a silicone rubber coat on a light-to-heat conversion layer. To be more specific, it is preferred to form by hardening using silicone of a fusion type as a cross-linking agent or by addition reaction of silicone of an addition type using a catalyst. When silicone of a fusion type is used, it is appropriate to use a composition in which 3 to 70 parts by mass of a cross-linking agent of a fusion type (b) and 0.01 to 40 part(s) by mass (part(s) by weight) of a catalyst (c) are added to 100 parts by mass of diorganopolysiloxane (a). The aforementioned diorganopolysiloxane which is the component (a) is a polymer having a repeating unit represented by the following formula. $R^1$ and $R^2$ each is a $C_{1-10}$ alkyl group, vinyl group or an aryl group and may have other appropriate substituent. It is usually preferred that 60% or more of $R^1$ and $R^2$ are methyl group, halogenated vinyl group, halogenated phenyl group, etc.

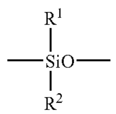

With regard to such a diorganopolysiloxane, it is preferred to use that which has hydroxyl group at both terminals. Number-average molecular weight of the aforementioned component (a) is 3,000 to 600,000 and, more preferably, 5,000 to 100,000. With regard to the cross-linking agent which is the component (b), anything may be used so far as it is a fission type and that which is represented by the following formula is preferred.

$R^1_m$—Si—$X_n$ (m+n=4; n is 2 or more)

Here, $R^1$ has the same meaning as that of the aforementioned $R^1$ and X is halogen atom such as Cl, Br or I, hydrogen atom, hydroxyl group or the following organic substituents.

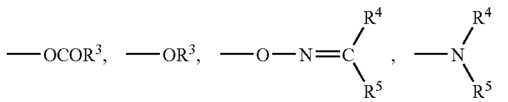

In the formulae, $R^3$ is a $C_{1-10}$ alkyl group or a $C_{6-20}$ aryl group and $R^4$ and $R^5$ each is a $C_{1-10}$ alkyl group.

With regard to the component (c), known catalysts such as carboxylate of metal including tin, zinc, lead, calcium and manganese may be listed and examples thereof are dibutyl tin laurate, lead octyloate, lead naphthenoate and platinic chloride.

When silicone of an addition type is used, it is preferred to use a compound where 0.1 to 25 part(s) by mass of organo hydrogen polysiloxane (e) and 0.00001 to 1 part by mass of an addition catalyst (f) are added to 100 parts by mass of diorganopolysiloxane having an addition-reactive functional group (d). The aforementioned diorganopolysiloxane having an addition-reactive functional group which is the component (d) is an organopolysiloxane having at least two alkenyl groups (preferably, vinyl groups) being directly bonded to silicone atom in a molecule in which the alkenyl group may be either at the terminal or middle of molecular weight and there may be a substituted or unsubstituted $C_{1-10}$ alkyl group or aryl group as an organic group other than the alkenyl group. It is also possible that the component (d) may have a small amount of hydroxyl group. Number-average molecular weight of the component (d) is 3,000 to 600,000 and, more preferably, 5,000 to 150,000.

Examples of the component (e) are polydimethylsiloxane having hydroxyl groups at both ends, α,ω-dimethylpolysiloxane, a copolymer of methylsiloxane with dimethylsiloxane having methyl groups at both ends, cyclic polymethylsiloxane, polymethylsiloxane having trimethylsilyl groups at both ends and a copolymer of diethylsiloxane with methylsiloxane having trimethylsilyl groups at both ends. The component (f) may be freely selected from known polymerization polymers and compounds of a platinum type are particularly preferred where examples thereof are platinum, platinum chloride, platinic chloride and olefin-oriented platinum.

In those compositions, it is also possible to add an inhibitor for cross-linking such as organopolysiloxane containing vinyl group such as tetracyclo(methylvinyl)siloxane, alcohol containing carbon-carbon triple bond, acetone, methyl ethyl ketone, methanol, ethanol and propylene glycol monomethyl ether for a purpose of controlling the hardening speed of a silicone rubber layer. The silicone rubber layer (D) used in the present invention is able to be formed by applying the aforementioned silicone-containing composition onto a light-to-heat conversion layer (C) using a solvent followed by drying. At that time, a membrane is formed as a result of condensation reaction or addition reaction of a silicone rubber composition upon drying of the solvent after application of the applying solution for formation of a silicone rubber layer and, therefore, when a drying temperature is low, hardening property of the silicone rubber lowers whereby the hardening may be poor. Therefore, drying temperature after application of the silicone rubber layer is preferably not lower than 80° C. and, more preferably, not lower than 100° C.

If necessary, fine powder of an inorganic substance such as silica, calcium carbonate and titanium oxide, an auxiliary adhesive such as silane coupling agent, titanate-type coupling agent and aluminum-type coupling agent and an initiator for photopolymerization may be added to the silicone rubber layer. With regard to applying amount (coating amount) of the solution for formation of a silicone rubber layer used in the present invention, it is preferably 0.5 to 5.0 $g/m^2$, more preferably 1.0 to 3.0 $g/m^2$ and, still more preferably, 1.5 to 2.0 $g/m^2$ in terms of a dry film amount. When the amount is made 0.5 $g/m^2$ or more, an ink-repulsive property does not lower and problems such as scratch is apt to be resulted are solved while, when it is made 5.0 $g/m^2$ or less, a developing property is not deteriorated. It is also possible that, for the purpose of improvement in resistance to printing, resistance to scratching, image reproducing property, staining property, etc., various silicone rubber layers are further applied on the silicone rubber layer to form a surface layer (Back Layer)

In a waterless lithographic printing plate precursor according to the present invention, at least one back layer is formed at the side of a support which is opposite to the side where a light-to-heat conversion layer and a silicone rubber layer are formed.

Although there is no particular limitation for the back layer, a layer in which particles of conductive metal oxide are dispersed in a binder is preferred.

The back layer of the present invention may also be made in a layer structure comprising two or more layers. When the back layer is made into a two- or more layered structure, all layers except the two layers are generally called back layers in a broad sense while, in a narrow sense, the lower layer is called a back layer and an upper layer thereof is called an overcoat layer or, from the lower side layer, they may be called first back layer, second back layer, etc. Incidentally, in the Examples of the present specification, they will be called first back layer, second back layer, etc.

The back layer may contain a matting agent. The back layer may also contain a slipping agent such as wax and surfactant.

Examples of the matting agent are oxides such as silicon oxide, aluminum oxide and magnesium oxide and polymers and copolymers such as poly(methyl methacrylate) and polystyrene having, preferably, an average particle size of 0.5 μm to 20 μm or, more preferably, 1.0 μm to 15 μm. Cross-linked particles of those polymers or copolymers are particularly preferred.

When a predetermined amount of such a matting agent is contained at least in any of the layers at the side of the back layer (back and/or overcoat layer(s)), a Bekk smoothness (in seconds) of the surface of the back layer side is able to be made 50 to 500 seconds, preferably 60 to 450 seconds and, more preferably, 200 to 400 seconds. Here, the Bekk smoothness (in seconds) of the surface of the back layer side is a value which is measured by a method mentioned in JIS-P8119-1998 and J. TAPPI Paper Pulp Test Method No. 5. When the Bekk smoothness of the surface of the back layer side is made 50 seconds or more, unevenness of the surface of the back layer side does not becomes too much and a matting agent is hardly dropped from the layer whereby a conveying property of the plate precursor does not lower with lapse of time. On the other hand, when the Bekk smoothness (in seconds) of the surface of the back layer side is 500 seconds or less, smoothness of the back layer side is not too high and conveying property of the plate precursor does not lower whereby various disadvantages as a result of poor conveying do not happen.

Conductive metal oxide particles may also be contained in the back layer. Examples of the materials for the conductive metal oxide particles are ZnO, $TiO_2$, $SnO_2$, $Al_2O_3$, $In_2O_3$, MgO, BaO and $MoO_3$ and compounded oxides thereof and/or metal oxide where said metal oxide further contains heteroatom.

With regard to the metal oxide, $SnO_2$, ZnO, $Al_2O_3$, $TiO_2$, $In_2O_3$ and MgO are preferred, $SnO_2$, ZnO, $In_2O_3$ and $TiO_2$ are more preferred and $SnO_2$ is particularly preferred. Examples of the case where small amount of heteroatom is contained are those where 0.01 to 30 molar % (preferably, 0.1 to 10 molar %) of heteroatom such as Al or In is doped to ZnO; Nb or Ta is doped to $TiO_2$; Sn is doped to $In_2O_3$; and Sb, Nb or halogen atom is doped to $SnO_2$. When adding amount of the heteroatom is 0.01 molar % or more, a sufficient electric conductivity is able to be given to oxides or compounded oxides while, when it is 30 molar % or less, blackening degree of the particles does not increase and the back layer is not blackened and is suitable as a sensitive material. Accordingly, as a material for conductive metal oxide particles in the present invention, that where small amount of heteroelement is contained in a small amount in metal oxide or in compounded metal oxide is preferred. It is also preferred that oxygen deficiency is contained in the crystal structure.

Preferably, the conductive metal oxide particles are contained within a range of 10 to 1,000% by weight or, more preferably, 100 to 800% by mass in a back layer to the total mass of the binder. When the amount is 10% a by mass or more, a sufficient antistatic property is achieved while, when it is 1,000% by mass or lower, detachment of the conductive metal oxide particles from sensitive material is able to be prevented.

With regard to particle size of the conductive metal oxide particles, although it is preferred to be small for making the scattering of light as little as possible, that is to be determined using the ratio of refractive indexes of the particles and the binder as a parameter and is able to be calculated using a theory of Mie.

An average particle size of the metal oxide particles in the back layer of the waterless lithographic printing plate precursor according to the present invention is preferably 0.001 to 0.5 μm and, more preferably, it is within a range of 0.003 to 0.2 μm. Here, the term of an average particle size is a value including not only the primary particle size of the conductive metal oxide particles but also the particle size of a high-order structure.

When fine particles of the aforementioned metal oxide is added to an applying solution for formation of a back layer, although they may be added as they are followed by dispersing, it is preferred to add as a dispersion where they are dispersed in a solvent such as water (which may, if necessary, contain a dispersing agent and a binder).

When the aforementioned metal oxide particles of the present invention are contained in the back layer in the present invention, surface electric resistance of the back layer side of the plate precursor at 10° and 15% RH is able to be adjusted to a range of $1\times10^7$ to $1\times10^{12}$ Ω or, preferably, $1\times10^9$ to $1\times10^{11}$ Ω and surface electric resistance at high temperature and high humidity is also able to be adjusted to a predetermined value. When the surface electric resistance of the back layer side of the waterless lithographic printing plate precursor at 10° C. and 15% RH is made $1\times10^7$ Ω or more, an abundant amount of the conductive metal oxide particles is not necessary whereby the particles are hardly detached and no secondary trouble such as that the detached particles become nuclei for repelling of coated membrane happens. When it is $1\times10^{12}$ or less, a desired antistatic property is available even at high temperature and high humidity, disadvantage in application upon manufacture of waterless lithographic printing plate precursor is prevented and slippage of focus of laser beam upon writing of the record caused by adhesion of dust, etc. onto the waterless lithographic printing plate precursor is prevented whereby sharpness of image record (reproducibility) is able to be improved.

Although there is no particular limitation for a binder used for a back layer of the waterless lithographic plate precursor used for the plate-making method of the present invention, a hardened product of acrylic resin with a melamine compound is preferred. In view of maintenance of good working environment and prevention of air pollution in the present invention, it is preferred for both polymer and melamine compound to use water-soluble ones or to use in a state of being dispersed in water such as an emulsion. With regard to the polymer, it is preferred to have any of methylol group, hydroxyl group, carboxyl group and glycidyl group so that its cross-linking reaction with a melamine compound is possible. Among the above, hydroxyl group and carboxyl group are preferred and carboxyl group is particularly preferred. Amount of hydroxyl group or carboxyl group in the polymer is preferably 0.0001 to 10 equivalent(s)/kg and, particularly preferably, 0.01 to 1 equivalent/kg.

Examples of the acrylic resin are a homopolymer of any of monomers comprising acrylic acid, acrylate such as alkyl acrylate, acrylamide, acrylonitrile, methacrylic acid, methacrylate such as alkyl methacrylate, methacrylamide and methacrylonitrile or a copolymer produced by polymerization of two or more kinds of such monomers. Among them, a homopolymer of any of monomers comprising acrylate such as alkyl acrylate and methacrylate such as alkyl methacrylate or a copolymer produced by polymerization of two or more kinds of such monomers is preferred. Examples thereof are a homopolymer of any of monomers comprising acrylate and methacrylate having an alkyl group of 1 to 6 carbon atom(s) and a copolymer produced by polymerization of two or more kinds of such monomers.

The aforementioned acrylic resin is a polymer which is prepared by using the above composition as a main component where a monomer having any of, for example, methylol group, hydroxyl group, carboxyl group and glycidyl group is partly used for making a cross-linking reaction with a melamine compound possible.

Examples of the melamine compound used in the present invention are a compound containing two or more (preferably, three or more) methylol groups or alkoxymethyl groups in a melamine molecule and a condensation polymer thereof such as melamine resin or melamine urea resin.

Examples of a primary condensate of melamine with formalin are dimethylolmelamine, trimethylolmelamine, tetramethylolmelamine, pentamethylolmelamine and hexamethylolmelamine and examples of the specific commercially available products thereof are Sumitex Resin M-3, MW, MK and MC (manufactured by Sumitomo Chemical) although they are non-limitative.

Examples of the aforementioned condensation polymers are hexamethylolmelamine resin, trimethylolmelamine resin and trimethyloltrimethoxymethylmelamine resin. Examples of the commercially available ones are MA-I and MA-204 (manufactured by Sumitomo Bakelite); Beckamine MA-S, Backamine APM and Beckamine J-101 (manufactured by Dainippon Ink & Chemicals), Euroid 344 (manufactured by Mitsui Toatsu Chemical); and Osbika Resin M31 and Oshika Resin PWP-8 (manufactured by Oshika Shinko) although they are non-limitative.

With regard to the aforementioned melamine compound, its functional equivalence in terms of a value expressed by dividing molecular weight by functional group numbers in a molecule is preferred to be 50 to 300. Here, a functional group means methylol group or alkoxymethyl group. When the value is made 300 or less, hardening density becomes appropriate and high strength is achieved. When the functional equivalent is 50 or more, hardening density is appropriate, transparency is not deteriorated and a good product is produced. Adding amount of said aqueous melamine compound to the aforementioned polymer is 0.1 to 100% by mass and, preferably, 10 to 90% by mass.

Each of those melamine compounds may be used solely or two or more thereof may be used jointly. Joint use with other compound is also possible and the hardeners mentioned, for example, in "The Theory of the Photographic Process" by C. E. Meer and T. H. James, Third Edition (1996); U.S. Pat. Nos. 3,316,095, 3,232,764, 3,288,775, 2,732,303, 3,635,718, 3,1232,763, 2,732,316, 2,586,168, 3,103,437, 3,017,280, 2,984,611, 2,725,294, 2,725,295, 3,100,704, 2,091,537, 3,321,313, 3,543,292 and 3,125,449 and British Patent Nos. 994,869 and 1,167,207 may be exemplified.

Representative examples of the aforementioned hardener are an aldehyde compound such as mucochloric acid, mucobromic acid, mucophenoxychloric acid, munophenoxybromic acid, formaldehyde, glyoxal, monomethylglyocsal, 2,3-dihydroxy-1,4-dioxane, 2,3-dihydroxy-5-methyl-1,4-dioxane succinaldehyde, 2,5-dimethoxytetrahydrofaran and glutaraldehyde and derivatives thereof, an active vinyl compound such as divinylsulfone-N,N'-ethylenebis(vinylsulfonylacetamide), 1,3-bis(vinylsulfonyl)-2-propanol, methylenebismaleimide, 5-acetyl-1,3-diacryloylhexahydro-s-triazine, 1,3,5-triacryloylhexahydro-s-triazine and 1,3,5-trivinylsulfonylhexahydro-s-trazine; an active halogen compound such as 2,4-dichloro-6-hydroxy-s-triazine sodium salt, 2,4-dichloor-6-(4-sulfonylanilino)-s-triazine sodium, 2,4-dichloro-6-(2-sulfoethylamino)-s-triazine and N,N'-bis(2-chloroethylcarbamyl)piperazine; an epoxy compound such as bis(2,3-epoxypropyl)methylpropylammonium p-toluenesulfonate, 1,4-bis(2',3'-epoxypropyloxy)butane, 1,3,5-triglycidyl isocyanurate, 1,3-diglycidyl-5-(γ-acetoxy-β-oxypropyl) isocyanurate, sorbitol polyglycidil ether, pentaerythritol polyglycidyl ether, diglycerol polyglycidyl ether, 1,3,5-triclygicyl(2-hydroxyethyl) isocyanurate, glycerol polyglycerol ether and trimethylolpropane polyglycidyl ether; an ethyleneimine compound such as 2,4,6-triethylene-s-triazine, 1,6-hexamethylene-N,N'-bis-ethyleneurea and bis-β-ethyleneiminoethyul thioether; a methanesulfonate compound such as 1,2-si(methanesulfonoxy)ethane, 1,4-di(methanesulfonoxy)butane and 1,5-di (methanesulfonoxy)pentane; a carbodiimide compound such as dicyclohexylcarbodiimide and 1-dicyclohexyl-3-(3-trimethylaminopropyl)carbodiimide hydrochloride; an isoxazole compound such as 2,5-dimethylisoxazole; an inorganic compound such as chromium alum and acetate alum; a peptide reagent of a dehydration condensation type such as N-carboethoxy-2-isopropoxy-1,2-dihydroquinone and N-(1-morpholinocarboxy)-4-methylpyridium chloride; an active ester compound such as N,N'-adipoyldioxysicuccinimide and N,N'-terephthaloyldioxydisuccinimide; an isocyanate such as toluene 2,4-diisocyanate and 1,6-hexamethylene diisocyanate; and an epichlorohydrin compound such as a reaction product of polyamide-polyaminie-epichlorohydrin. They are, however, non-limitative.

Examples of the surfactant are known anionic surfactants, cationic surfactants, amphoteric surfactants and nonionic surfactants.

Examples of a slipping agent are a $C_{8-22}$ higher alcohol phosphate or an amino salt thereof; palmitic acid, stearic acid, behenic acid and esters thereof; and a silicone compound.

The back layer is prepared in such a manner that the aforementioned components as they are or a dispersion thereof after dispersing in a solvent such as water (containing a dispersing agent, a binder, etc. if necessary) is added to and mixed (dispersed if necessary) with an aqueous dispersion or an aqueous solution of a binder or appropriate additives and the resulting application liquid for the formation of a back layer is applied and dried.

The back layer is able to be applied in such a manner that the aforementioned application liquid for the formation of a back layer is applied on the surface of a support (at the side where a light-to-heat conversion layer and a silicone rubber layer are not formed) by a commonly well-known applying method such as a dip coating method, an air knife coating method, a curtain coating method, a wire bar coating method, a gravure coating method and an extrusion coating method.

Although there is no particular limitation for the thickness of the back layer, it is preferably within a range of 0.01 to 1 μm and, more preferably, within a range of 0.1 to 0.5 μm. When it is 0.01 μm or more, the applying agent is apt to be uniformly applied and uneven coating is hardly resulted in the product and, when it is 1 μm or less, antistatic property and resistance to scratching do not lower.

(Plate-Making Method)

As hereunder, a plate-making method for lithographic printing plate from a waterless lithographic printing plate precursor according to the present invention will be illustrated. As same as in the common plate-making method, the present plate-making method includes an exposing step where close adhesion to a layer adjacent to a silicone rubber layer of the exposed area is lowered by an image-forming exposure and a developing step where the silicone rubber layer in which the close adhesion lowers is removed and an ink-acceptable region is formed.

(I) Exposing Step

Laser which is used for exposure of a waterless lithographic printing plate precursor according to the present invention should be such a one which gives an exposing amount for causing a sufficient lowering of close adhesion so that the silicone rubber layer is exfoliated and removed. There is no particular limitation for laser species provided that the aforementioned conditions are satisfied and it is possible to use gas laser such as Ar laser and carbon dioxide gas laser, solid laser such as YAG laser, semiconductor laser, etc. Usually, laser where its output is in a level of 50 mW or higher is necessary. From a practical view such as maintenance and cost, semiconductor laser and semiconductor-excited solid laser (such as YAG laser) are advantageously used. Recording wavelength of such a laser is the wavelength of infrared ray and it is often to use an oscillation wavelength from 800 nm of 1,100 nm. It is also possible to expose using an imaging apparatus mentioned in JP 06/186,750 A or "Quickmaster DI46-4" (trade name) which is a full-color printing system of Heidelberg.

(II) Developing Step

With regard to a developing solution used in plate-making of lithographic printing plate from a waterless lithographic printing plate precursor according to the present invention, that which has been known as a developing solution for an waterless lithographic printing plate precursor been used and hydrocarbon, polar solvent, water and a combination thereof may be used for example. From the viewpoint of safety, it is preferred to use an aqueous solution using water and an organic solvent where water is a main component and, when safety, flammability, etc. are taken into consideration, concentration of the organic solvent is preferred to be less than 40% by mass. Examples of the hydrocarbon which is able to be used are an aliphatic hydrocarbon (specific examples thereof are hexane, heptane, gasoline, kerosene and "Isoper-E, H and G" (Esso Chemical) which are commercially available solvents), an aromatic hydrocarbon (such as toluene and xylene) and a halogenated hydrocarbon (such as trichlene). Examples of the polar solvent are an alcohol (specific examples thereof are methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol and tetraethylene glycol), a ketone (such as acetone and methyl ethyl ketone), an ester (such as ethyl acetate, methyl lactate, butyl lactate, propylene glycol monomethyl ether acetate, diethylene glycol acetate and diethyl phthalate) and others such as triethyl phosphate and tricredyl phosphate. It is also possible to use just water itself such as tap water, pure water and distilled water. Each of them may be used solely or two kinds or more such as that water is added to hydrocarbon, water is added to polar solvent or hydrocarbon is combined with polar solvent may be used as well. With regard to those which have low affinity to water among the aforementioned hydrocarbon and polar solvent their solubility in water is able to be improved by addition of a surfactant or the like. It is also possible to add an alkali agent (such as sodium carbonate, diethanolamine and sodium hydroxide) together with the surfactant.

Development may be carried out by a commonly known method such as that the plate surface is scrubbed with a pad for development containing the aforementioned developing solution or scrubbed with a developing brush in water after the developing solution is poured over the plate surface. Although temperature of the developing solution may be free, it is preferred to be 10° C. to 50° C. As a result thereof, a silicone rubber layer which is an ink-repulsive layer in the image area is removed and the corresponding part becomes an ink-receiving area. The aforementioned developing treatment or and washing and drying treatments after that may be carried out by an automated processing machine. Preferred automated processing machines as such are mentioned in JP 02/220,061 A. Moreover, when "Quickmaster DI46-4" which is a full-color printing system mentioned already is used, exposure and developing on a desk are able to be carried out continuously under an advantageous condition.

It is also possible that a waterless lithographic printing plate precursor according to the present invention is developed by such a manner that an adhesive layer is adhered to the surface of a silicone rubber layer and then the adhesive layer is exfoliated. With regard to the adhesive layer, any of known ones which are able to closely adhere on the surface of the silicone rubber layer may be used. A product where such an adhesive layer is provided in a flexible support is commercially available as, for example, “Scotch Tape #851A” from Sumitomo 3M.

When a lithographic printing plate which is processed and plated as such is stored by piling them up, it is preferred to put an inserting paper between the plates for protecting the printing plate. The lithographic printing plate manufactured by said plate-making method is provided in a printer and it is now possible to give many sheets of good prints where an ink-adhering property at the image area is excellent.

The present invention will now be illustrated in more detail by way of the Example. However, the present invention is not limited to the following Examples only.

EXAMPLES 1 TO 39 AND COMPARATIVE EXAMPLES 1 TO 4

Formation of a First Back Layer

On a web-shaped support of a biaxially-stretched polyethylene terephthalate film subjected to a corona discharge treatment of 0.01 kW/$m^2$/minute on the surface of 180 μm thickness, the following applying solution was applied by a wire bar coating method and dried at 180° C. for 30 seconds to form a first back layer having a dry thickness of 0.2 μm.

<Application Solution for the First Back Layer>

| | |
|---|---|
| Jurymer ET-410 (aqueous dispersion of acrylic resin manufactured by Nippon Junyaku; solid: 30% by mass) | 1.9 parts by mass |
| Conductive particles (aqueous dispersion of tin oxide/antimony oxide; average particle size: 0.05 μm; 17% by mass) | 9.1 parts by mass |
| Denacol EX-614B (an epoxy compound manufactured by Nagase Chemtex; concentration of effective ingredient: 100% by mass) | 0.18 part by mass |
| Sanded BL (aqueous solution of sodium alkylsulfonate, manufactured by Sanyo Chemical Industries; 44% by mass) | 0.14 part by mass |
| Emalex 710 (polyoxyethylene alkyl ether, manufactured by Nippon Emulsion; 100% by mass) | 0.06 part by mass |
| Distilled water | 89 parts by mass |
| (Formation of a second back layer) | |

The following applying solution was applied on the aforementioned first back layer by a wire bar coating method and dried at 170° C. for 30 seconds to form a second back layer having a dry thickness of 0.07 μm.

<Applying Solution for the Second Back Layer>

| | |
|---|---|
| Chemiperal S-120 (latex of polyolefin type manufactured by Mitsui Chemical; solid: 27% by mass) | 1.6 parts by mass |
| Snowtex C (colloidal silica manufactured by Nissan Chemical; solid: 20% by mass) | 1.1 parts by mass |
| Sanded BL (aqueous solution of sodium alkylsulfonate, manufactured by Sanyo Chemical Industries; 44% by mass) | 0.12 part by mass |
| Emalex 710 (polyoxyethylene alkyl ether manufactured by Nippon Emulsion; 100% by mass) | 0.05 part by mass |

-continued

| | |
|---|---|
| Denacol EX-614B (an epoxy compound manufactured by Nagase Chemtex; concentration of effective ingredient: 100% by mass) | 0.15 part by mass |
| Chemipearl W-950 (polyolefin matting agent manufactured by Mitsui Chemical; solid: 40% by mass) | 0.04 part by mass |
| Distilled water | 97 parts by mass |

Corona Discharge Treatment

On the surface of the side being opposite to the aforementioned support equipped with a back layer, a corona discharge treatment was carded out at the treating amount (discharge amount) shown in Table 1 by R8-8 which is a corona surface treating machine manufactured by KNI Powder System using air as atmosphere. The support was once rolled and allowed to stand for the period shown in Table 1 under the condition of 25° C./50% RH.

Formation of a Light-to-Heat Conversion Layer

The following mixed solution was stirred for 30 minutes using a paint shaker together with glass beads so that carbon black was dispersed, the glass beads were filtered off and the filtrate was mixed and stirred with 0.005 g of KF333 which is a surfactant (manufactured by Dainippon Ink & Chemical) to prepare an application solution for a light-to-heat conversion layer.

The application solution was applied on the side of the support which was subjected to a corona discharge treatment and allowed to stand after said corona discharge treatment by a wire bar coating method so as to make its dry thickness 1.0 μm. It was dried by heating at 150° C. for 1 minute to form a light-to-heat conversion layer.

<Application Solution for a Light-to-Heat Conversion Layer>

| | |
|---|---|
| Polyurethane (a reaction product from 5 mol of diphenylmethane diisocyanate, 1 mol of polypropylene glycol and 4 mol of 2,2'-dimethylolpropanoic acid) | 3.0 parts by mass |
| Carbon black mentioned in Table 1 | in an amount of Table 1 |
| Solsperse S 24000R (manufactured by ICI) | 0.15 part by mass |
| Solsperse S 17000 (manufactured by ICI) | 0.15 part by mass |
| Methyl ethyl ketone | 29 parts by mass |
| Propylene glycol monomethyl ether | 15 parts by mass |

Formation of a Silicone Rubber Layer

The following application solution was applied on the aforementioned light-to-heat conversion layer and dried by heating at 150° C. for 1 minute to form a silicone rubber layer of an addition type having a dry thickness of 1.5 g/$m^2$.

<Application Solution for the Silicone Rubber Layer>

| | |
|---|---|
| FS-42 (α,ω-divinylpolydimethylsiloxane manufactured by Shinetsu Chemical; average degree of polymerization: 1,300) | 9.0 parts by mass |

-continued

| | |
|---|---|
| $(CH_3)_3SiO(SiH(CH_3)O)_8$—$Si(CH_3)_3$ | 0.2 part by mass |
| Olefin-oriented platinum catalyst | 0.1 part by mass |
| Controlling agent $[HC{\equiv}C$—$C(CH_3)_2$—O—$Si(CH_3)_3]$ | 0.2 part by mass |
| Isoper E (manufactured by Exxon Kagaku) | 120.0 parts by mass |

In the manner as mentioned above, waterless lithographic printing plate precursors used for Examples 1 to 39 and Comparative Examples 1 to 4 were prepared.

EXAMPLES 40 TO 62 AND COMPARATIVE EXAMPLES 5 TO 8

As same as the aforementioned Example 1, first back layer and second back layer were formed on a support.

Formation of a Light-to-Heat Conversion Layer

The following mixed solution was stirred for 30 minutes using a paint shaker together with glass beads so that carbon black was dispersed, the glass beads were filtered off and the

TABLE 1

| | Support - | Support - | Carbon Black in Light-to-heat conversion layer | | | |
|---|---|---|---|---|---|---|
| Samples | Amount of Corona Treatment ($kW/m^2/min$) | Elapsed Time after Corona Treatment | Type | pH | Volatile Substance | Added Amount (part(s) by mass) |
| Example 1 | 0.01 | 10 min | MA-230 (manufd by Mitsubishi Chem) | 3.0 | 1.5 | 2.0 |
| Example 2 | | 60 min | | | | |
| Example 3 | | 1 day | | | | |
| Example 4 | | 3 days | | | | |
| Example 5 | | 25 days | | | | |
| Example 6 | 0.06 | 10 min | | | | |
| Example 7 | | 60 min | | | | |
| Example 8 | | 1 day | | | | |
| Example 9 | | 3 days | | | | |
| Example 10 | | 25 days | | | | |
| Example 11 | 0.09 | 10 min | | | | |
| Example 12 | | 60 min | | | | |
| Example 13 | | 1 day | | | | |
| Example 14 | | 3 days | | | | |
| Example 15 | | 25 days | | | | |
| Example 16 | 0.12 | 10 min | | | | |
| Example 17 | | 60 min | | | | |
| Example 18 | | 1 day | | | | |
| Example 19 | | 3 days | | | | |
| Example 20 | | 25 days | | | | |
| Example 21 | 0.09 | 60 min | #4000B (manufd by Mitsubishi Chem) | 10.0 | 0.3 | 2.0 |
| Example 22 | | 1 day | | | | |
| Example 23 | 0.09 | 60 min | #40 (manufd by Mitsubishi Chem) | 7.5 | 0.8 | 2.0 |
| Example 24 | | 1 day | | | | |
| Example 25 | 0.09 | 60 min | #50 (manufd by Mitsubishi Chem) | 6.0 | 1.5 | 2.0 |
| Example 26 | | 1 day | | | | |
| Example 27 | 0.09 | 60 min | MA-11 (manufd by Mitsubishi Chem) | 3.5 | 1.6 | 2.0 |
| Example 28 | | 1 day | | | | |
| Example 29 | 0.09 | 60 min | MA-220 (manufd by Mitsubishi Chem) | 3.0 | 1.2 | 2.0 |
| Example 30 | | 1 day | | | | |
| Example 31 | 0.09 | 1 day | MA-230 (manufd by Mitsubishi Chem) | 3.0 | 1.5 | 1.6 |
| Example 32 | | | | | | 1.8 |
| Example 33 | | | | | | 2.2 |
| Example 34 | | | | | | 2.4 |
| Example 35 | 0.09 | 1 day | Carbon black (1) | 6.0 | 1.2 | 2.0 |
| Example 36 | | | Carbon black (2) | 4.5 | 1.2 | 2.0 |
| Example 37 | | | Carbon black (3) | 3.5 | 1.2 | 2.0 |
| Example 38 | | | Carbon black (4) | 3.0 | 1.2 | 2.0 |
| Example 39 | | | Carbon black (5) | 3.5 | 1.2 | 2.0 |
| Comp. Ex. 1 | 0.09 | 1 min | MA-230 (manufd by Mitsubishi Chemical) | 3.0 | 1.5 | 2.0 |
| Comp. Ex. 2 | 0.09 | 40 days | | | | |
| Comp. Ex. 3 | 0.005 | 1 day | | | | |
| Comp. Ex. 4 | 0.15 | 1 day | | | | |

*: With regard to carbon black (1) to (5), production process thereof will be shown later.

filtrate was mixed and stirred with 0.005 g of KF333 which is a surfactant (manufactured by Dainippon Ink & Chemical) to prepare an application solution for a flight-to-heat conversion layer.

After the surface of a side opposite to the support where the aforementioned back layer was formed was subjected to a corona discharge treatment so that the O/C element ratio determined by calculation of the method which will be mentioned later was made the value mentioned in Table 2, the application solution was applied on said side so as to make its dry thickness 1.0 μm. It was dried by heating at 150° C. for 1 minute to form a light-to-heat conversion layer.

<Application Solution for the Light-to-Heat Conversion Layer>

| | |
|---|---|
| Polyurethane | 3.0 parts by mass |
| (a reaction product from 5 mol of diphenylmethane diisocyanate, 1 mol of polypropylene glycol and 4 mol of 2,2'-dimethylolpropanoic acid) | |
| Carbon black mentioned in Table 2 | in amount of Table 2 |
| Solsperse S 24000R (manufactured by ICI) | 0.15 part by mass |
| Solsperse S 17000 (manufactured by ICI) | 0.15 part by mass |
| Methyl ethyl ketone | 29 parts by mass |
| Propylene glycol monomethyl ether | 15 parts by mass |

After the light-to-heat conversion layer was formed, a silicone rubber layer was formed by the same manner as in Example 1 to prepare waterless lithographic printing plate precursors used for Examples 40 to 62 and Comparative Examples 5 to 8.

O/C Element Ratio on the Surface of the Support After a Corona Discharge Treatment by ESCA An ESCA measuring apparatus of PHI-5400MC was used, measurement was carried out under the condition where X-ray source was Mg—Kα (400 W), path energy was 71.55 eV/178,95 eV, analyzed area was 1.1 mmø, measuring mode was narrow scan (C1s, O1s, N1s) and taking-out angle of photoelectron was 20° and, from the element composition ratio, an O/C element ratio was calculated. Three measurements were conducted for each sample and their mean value was determined.

<Carbon Black (1)>

#40 (manufactured by Mitsubishi Chemical) which is a material carbon black was placed in a gas-phase fluidizing vessel connected to an ozone generator in an amount corresponding to 1/10 of the volume of the column and oxidizing treatment was conducted under the condition that flow rate of ozone was 2.0 $Nm^3$/hr, concentration of ozone was 10 g/$Nm^3$, reaction time was 50 minutes and temperature was room temperature to give carbon black (1) which was subjected to an oxidizing treatment.

<Carbon Black (2)>

#40 (manufactured by Mitsubishi Chemical) which is a material carbon black was spread all over a heat-resisting vat in a thickness of about 2 mm, placed in an electric furnace of atmospheric ambience, heated up to 350° C. at a rising rate of 50° C./hr, kept for 5 hours and subjected to a natural cooling to give carbon black (2) which was subjected to an oxidizing treatment.

TABLE 2

| Samples | O/C Element Ratio of Support Surface after Corona Discharge | Carbon Black in Light-to-heat conversion layer Type | pH | Volatile Substance | Added Amount (part(s) by mass) |
|---|---|---|---|---|---|
| Example 40 | 0.42 | #4000B (manufd by | 10.0 | 0.3 | 2.0 |
| Example 41 | 0.46 | Mitsubishi Chem) | | | |
| Example 42 | 0.42 | #30 (manufd by Mitsubishi | 8.0 | 0.6 | 2.0 |
| Example 43 | 0.46 | Chem) | | | |
| Example 44 | 0.42 | #40 (manufd by Mitsubishi | 7.5 | 0.8 | 2.0 |
| Example 45 | 0.46 | Chem) | | | |
| Example 46 | 0.42 | #50 (manufd by Mitsubishi | 6.0 | 1.5 | 2.0 |
| Example 47 | 0.46 | Chem) | | | |
| Example 48 | 0.42 | MA-11 (manufd by | 3.5 | 1.6 | 2.0 |
| Example 49 | 0.46 | Mitsubishi Chem) | | | |
| Example 50 | 0.42 | MA-220 (manufd by | 3.0 | 1.2 | 2.0 |
| Example 51 | 0.46 | Mitsubishi Chem) | | | |
| Example 52 | 0.46 | MA-230 (manufd by | 3.0 | 1.5 | 1.6 |
| Example 53 | | Mitsubishi Chem) | | | 1.8 |
| Example 54 | 0.42 | | | | 2.0 |
| Example 55 | 0.46 | | | | |
| Example 56 | | | | | 2.2 |
| Example 57 | | | | | 2.4 |
| Example 58 | 0.45 | Carbon black (1) | 6.0 | 1.2 | 2.0 |
| Example 59 | | Carbon black (2) | 4.5 | 1.2 | 2.0 |
| Example 60 | | Carbon black (3) | 3.5 | 1.6 | 2.0 |
| Example 61 | | Carbon black (4) | 3.0 | 1.3 | 2.0 |
| Example 62 | | Carbon black (5) | 3.5 | 1.5 | 2.0 |
| Comp. Ex. 5 | 0.37 (no corona treatment) | #40 (manufd by Mitsubishi | 7.5 | 0.8 | 2.0 |
| Comp. Ex. 6 | 0.40 | Chem) | | | |
| Comp. Ex. 7 | 0.37 (no corona treatment) | MA-230 (manufd by Mitsubishi | 3.0 | 1.5 | 2.0 |
| Comp. Ex. 8 | 0.40 | Chem) | | | |

<Carbon Black (3)>

#40 (manufactured by Mitsubishi Chemical) (10 g) which is a material carbon black was mixed with 450 g of a 30% by mass aqueous solution of hydrogen peroxide, adjusted to pH 1 by addition of sulfuric acid, allowed to stand for 12 hours at room temperature, filtered, washed with water and dried to give carbon black (3) which was subjected to an oxidizing treatment.

<Carbon Black (4)>

#40 (manufactured by Mitsubishi Chemical) (10 g) which is a material carbon black was mixed with 30 g of a 60% by mass aqueous solution of nitric acid, allowed to stand for 48 hours at room temperature, filtered, washed with water and dried to give carbon black (4) which was subjected to an oxidizing treatment.

<Carbon Black (5)>

#40 (manufactured by Mitsubishi Chemical) (10 g) which is a material carbon black was mixed with 250 g of a solution of potassium permanganate in 4N sulfuric acid, allowed to stand for 2 hours at room temperature, filtered, washed with water and dried to give carbon black (5) which was subjected to an oxidizing treatment.

Evaluation of the Waterless Lithographic Printing Plate Precursor

Model Evaluation of Resistance to Scratch

The resulting waterless lithographic printing plate precursor of the present invention was subjected to a halftone dot image formation of 1,751 pi (1,270 dpi) using a Pearl Setter (a plate setter manufactured by Presstek) (wavelength; 830 nm; beam diameter: 28 μm ($1/e^2$)). After that, the plate surface was rubbed with a pad for development in which a treating solution 1 of the following composition was impregnated to remove a silicone rubber layer of the area to which laser was irradiated. As a result, a waterless lithographic printing plate having silicone image with sharp edges in which halftone area rate of 2% to 98% was reproduced.

<Treating Solution 1>

| | |
|---|---|
| Polyoxyethylene sorbitan monooleate (Rheodol TW-O106 manufactured by Kao) | 5 g |
| BK2 (fur preventer manufactured by Fuji Photo Film) | 2 g |
| Water | 993 g |

In order to evaluate the resistance to scratch of the waterless lithographic printing plate as such, a scratch test was conducted in such a manner that the non-image area of the resulting waterless lithographic printing plate was tested with a sapphire needle (diameter: 0.5 mm) of loads varying from 50 to 500 g at intervals of 50 g. Printing was carried out using the waterless lithographic printing plate prepared as such (printer: Dia 1F-2 manufactured by Mitsubishi Heavy Industries; ink: Aqualess Echo New M Ink manufactured by Toyo Ink Manufacturing; cooling of ink-applied roller: 20° C.), generation of stains at the scratch part of the non-image area in the print after printing of 500 sheets was checked and the load of a sapphire needle by which ink staining started to generate was read and used as an index for the present evaluation. The result is shown in Tables 3 and 4.

TABLE 3

| Samples | Model Evaluation for Resistance to Scratch (Load whereby Ink Staining was Started to be Generated) |
|---|---|
| Example 1 | 400 g |
| Example 2 | 450 g |
| Example 3 | 450 g |
| Example 4 | 450 g |
| Example 5 | 350 g |
| Example 6 | 500 g |
| Example 7 | no ink staining was generated |
| Example 8 | no ink staining was generated |
| Example 9 | no ink staining was generated |
| Example 10 | 450 g |
| Example 11 | 500 g |
| Example 12 | no ink staining was generated |
| Example 13 | no ink staining was generated |
| Example 14 | no ink staining was generated |
| Example 15 | 500 g |
| Example 16 | 450 g |
| Example 17 | 500 g |
| Example 18 | 500 g |
| Example 19 | 400 g |
| Example 20 | 400 g |
| Example 21 | 400 g |
| Example 22 | 400 g |
| Example 23 | 450 g |
| Example 24 | 450 g |
| Example 25 | 500 g |
| Example 26 | 500 g |
| Example 27 | no ink staining was generated |
| Example 28 | no ink staining was generated |
| Example 29 | no ink staining was generated |
| Example 30 | no ink staining was generated |
| Example 31 | 400 g |
| Example 32 | 500 g |
| Example 33 | no ink staining was generated |
| Example 34 | 500 g |
| Example 35 | 500 g |
| Example 36 | no ink staining was generated |
| Example 37 | no ink staining was generated |
| Example 38 | no ink staining was generated |
| Example 39 | no ink staining was generated |
| Comp. Ex. 1 | 150 g |
| Comp. Ex. 2 | 50 g |
| Comp. Ex. 3 | 50 g |
| Comp. Ex. 4 | 150 g |

TABLE 4

| Samples | Model Evaluation for Resistance to Scratch (Load whereby Ink Staining was Started to be Generated) |
|---|---|
| Example 40 | 350 g |
| Example 41 | 400 g |
| Example 42 | 350 g |
| Example 43 | 400 g |
| Example 44 | 350 g |
| Example 45 | 400 g |
| Example 46 | 450 g |
| Example 47 | 500 g |
| Example 48 | 500 g |
| Example 49 | no ink staining was generated |
| Example 50 | 450 g |
| Example 51 | 500 g |
| Example 52 | 500 g |
| Example 53 | no ink staining was generated |
| Example 54 | 500 g |
| Example 55 | no ink staining was generated |
| Example 56 | no ink staining was generated |
| Example 57 | no ink staining was generated |
| Example 58 | 450 g |
| Example 59 | 450 g |
| Example 60 | no ink staining was generated |
| Example 61 | 500 g |
| Example 62 | no ink staining was generated |
| Comp. Ex. 5 | 50 g |

TABLE 4-continued

| Samples | Model Evaluation for Resistance to Scratch (Load whereby Ink Staining was Started to be Generated) |
|---|---|
| Comp. Ex. 6 | 100 g |
| Comp. Ex. 7 | 50 g |
| Comp. Ex. 8 | 150 g |

It will be apparent from Tables 3 and 4 that the waterless lithographic printing plate precursor of the Examples according to the present invention has a good resistance to scratch and that Examples 1 to 20, Examples 25 to 39 and Examples 46 to 62 in which a light-to-heat conversion layer containing carbon black which was subjected to an oxidizing treatment was jointly used showed a particularly good resistance to scratch while the waterless lithographic printing plate precursor of Comparative Examples 1 to 8 showed an unsatisfactory result.

Evaluation for Resistance to Scratch in Practical Use

The waterless lithographic printing plate precursors used for the Examples and the Comparative Examples of the present invention were processed in rolls and then provided in "Quickmaster DI46-4pro" which is a full-color printing system machine manufactured by Heidelberg. After that, exposure to light, removal of silicone refuse on the exposed area and printing (ink: Aqualess Echo New M Ink manufactured by Toyo Ink Manufacturing) were conducted on this printer and an evaluation was conducted whether ink staining on the print after printing of 20,000 sheets due to scratch was noted. The result was that, in the waterless lithographic printing plates of the Comparative Examples, two ink stains in average per plate were generated while, in the waterless lithographic printing plates of the Examples, no ink staining was generated at all but good prints were obtained.

While the invention has been described in detail and with reference to specific embodiments thereof, it will be apparent to one skilled in the art that various changes and modifications can be made therein without departing from the spirit and scope thereof.

The present application claims foreign priority based on Japanese Patent Application Nos. JP2004-295297 and JP2004-295298, both filed on Oct. 7 of 2004, the contents of which is incorporated herein by reference.

What is claimed is:

1. A method for manufacturing a lithographic printing plate precursor requiring no dampening water, the lithographic printing plate precursor comprising: a support, a light-to heat conversion layer; and a silicone rubber layer in this order, the method comprising:

subjecting a surface of the support to a corona discharge treatment in a discharge amount of 0.01 to 0.12 $kW/m^2/$minute; and providing the light-to-heat conversion layer directly on the surface of the support after 10 minutes to one month from the corona discharge treatment.

2. The method for manufacturing a lithographic printing plate precursor requiring no dampening water according to claim 1, wherein the support comprises a biaxially-stretched polyethylene terephthalate.

3. The method for manufacturing a lithographic printing plate precursor requiring no dampening water according to claim 1, wherein the discharge amount is 0.06 to 0.09 $kW/m^2/$minute.

4. The method for manufacturing a lithographic printing plate precursor requiring no dampening water according to claim 1, wherein the light-to-heat conversion layer comprises carbon black that is subjected to an oxidizing treatment.

5. The method for manufacturing a lithographic printing plate precursor requiring no dampening water according to claim 4, wherein the light-to-heat conversion layer has a carbon black content of 35% by weight or more based on a total solid content of the light-to-heat conversion layer.

* * * * *